(12) United States Patent
Lim

(10) Patent No.: US 7,554,143 B2
(45) Date of Patent: Jun. 30, 2009

(54) CMOS IMAGE SENSOR AND METHOD OF FABRICATING THE SAME

(75) Inventor: Bi O Lim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 57 days.

(21) Appl. No.: 11/529,510

(22) Filed: Sep. 29, 2006

(65) Prior Publication Data

US 2007/0018213 A1 Jan. 25, 2007

Related U.S. Application Data

(62) Division of application No. 11/024,071, filed on Dec. 29, 2004, now Pat. No. 7,163,834.

(30) Foreign Application Priority Data

Jun. 22, 2004 (KR) .................. P 10-2004-0046536

(51) Int. Cl.
*H01L 31/062* (2006.01)
*H01L 31/113* (2006.01)

(52) U.S. Cl. .................. 257/294; 257/292; 257/432; 257/E27.133

(58) Field of Classification Search .................. 257/292, 257/294, E27.133
See application file for complete search history.

(56) References Cited

U.S. PATENT DOCUMENTS

| | | | |
|---|---|---|---|
| 6,043,001 A | 3/2000 | Hirsh et al. | |
| 6,127,668 A | 10/2000 | Baek | |
| 6,232,590 B1 | 5/2001 | Baek | |
| 6,307,243 B1 | 10/2001 | Rhodes | |
| 6,369,417 B1 | 4/2002 | Lee | |
| 6,617,189 B1 | 9/2003 | Chen et al. | |
| 6,861,280 B2 | 3/2005 | Yamamoto | |
| 6,903,395 B2 * | 6/2005 | Nakai et al. .................. 257/294 |
| 6,933,167 B2 | 8/2005 | Yamamoto | |
| 6,979,588 B2 | 12/2005 | Jeong et al. | |
| 7,453,130 B2 * | 11/2008 | Nakai .................. 257/432 |
| 2001/0010952 A1 | 8/2001 | Abramovich | |
| 2001/0054677 A1 | 12/2001 | Nakashima | |
| 2002/0027228 A1 * | 3/2002 | Lee .................. 257/69 |
| 2003/0168679 A1 | 9/2003 | Nakai et al. | |
| 2003/0197210 A1 * | 10/2003 | Uchida .................. 257/294 |
| 2004/0183086 A1 | 9/2004 | Nakai | |
| 2004/0185588 A1 | 9/2004 | Fukuyoshi et al. | |
| 2004/0214368 A1 * | 10/2004 | Rhodes .................. 438/57 |
| 2005/0052562 A1 | 3/2005 | Shimizu et al. | |
| 2005/0085087 A1 | 4/2005 | Okigawa et al. | |
| 2005/0139945 A1 | 6/2005 | Lim | |
| 2005/0274968 A1 | 12/2005 | Kuo et al. | |

(Continued)

*Primary Examiner*—Ngan Ngo
(74) *Attorney, Agent, or Firm*—Finnegan, Henderson, Farabow, Garrett & Dunner, L.L.P.

(57) ABSTRACT

A complementary metal-oxide semiconductor (CMOS) image sensor and a method of fabricating the same are disclosed. In a complementary metal-oxide semiconductor (CMOS) image sensor including a photodiode receiving irradiated light and generating electric charges, a plurality of conductive circuits each formed in different layers, a plurality of interlayer dielectrics insulating the conductive circuits, and a micro-lens formed of the interlayer dielectrics and focusing the irradiated light to the photodiode, the CMOS image sensor includes a lens formed in a dome shape on any one of the interlayer dielectrics and re-focusing the light focused by the micro-lens to the photodiode.

1 Claim, 10 Drawing Sheets

U.S. PATENT DOCUMENTS

| | | |
|---|---|---|
| 2006/0012001 A1 | 1/2006 | Kim |
| 2006/0033176 A1 | 2/2006 | Mun |
| 2006/0057765 A1* | 3/2006 | Hsu et al. .................... 438/70 |
| 2006/0081955 A1 | 4/2006 | Hong |
| 2008/0102554 A1* | 5/2008 | Abe et al. .................... 438/70 |
| 2008/0135964 A1* | 6/2008 | Hashimoto .................. 257/432 |

* cited by examiner screen screen

RF Bias sputter etch wet etch

CMOS IMAGE SENSOR AND METHOD OF FABRICATING THE SAME

This application claims the benefit of priority of the Korean Patent Application No. 10-2004-0046536, filed on Jun. 22, 2004, and this application is a divisional of application Ser. No. 11/024,071, filed Dec. 29, 2004 now U.S. Pat. No. 7,163834. The entire contents of these applications are hereby incorporated by reference in their entirety.

BACKGROUND OF THE INVENTION

1. Field of the Invention

The present invention relates to an image sensor, and more particularly, to a complementary metal-oxide-metal (CMOS) image sensor and a method of fabricating the same. Although the present invention is suitable for a wide scope of applications, it is particularly suitable for enhancing light focusing characteristics.

2. Discussion of the Related Art

Generally, an image sensor is a semiconductor device, which converts an optic image to an electric signal. More specifically, a charge coupled device (CCD) is a device having a plurality of metal-oxide-metal (MOS) capacitors each formed within a proximate range from one another, and wherein a carrier electric charge is stored in and transmitted to each capacitor. A complementary MOS (CMOS) image sensor is a device forming a number of MOS transistors corresponding to the number of pixels by using the CMOS technology, which uses a control circuit and a signal processing circuit as peripheral circuits, and adopting a switching method, which uses the MOS transistors to sequentially detect each output.

However, the CCD is disadvantageous in that the driving method is complicated and consumes a large amount of power, and the fabrication process is complicated having too many mask process steps. Furthermore, a one-chip circuit cannot be easily formed because the signal processing circuit cannot be realized in the CCD chip. Recently, in order to overcome such disadvantages, a CMOS image sensor using sub-micron CMOS fabrication technology has been under development. The CMOS image sensor includes a photodiode and a MOS transistor formed within the unit pixel and uses a switching method to sequentially detect each signal, thereby representing an image. Herein, power consumption can be reduced by using the CMOS fabrication technology, and the number of masks is reduced to 20, as compared to the CCD fabrication process requiring 30 to 40 masks, thereby simplifying the fabrication process. Also, a plurality of signal processing circuits and one-chip circuits can be formed. For such reasons, the CMOS image sensor is being considered as the next generation image sensor.

FIG. 1 illustrates a circuit diagram of a unit pixel of a general CMOS image sensor, which includes a photodiode (PD) and four MOS transistors. The unit pixel includes a photodiode (PD) receiving light so as to form photocharge, a transfer transistor (Tx) transferring photocharge collected in the photodiode (PD) to a floating diffusion (FD) area, a reset transistor (Rx) setting an electrical potential of the floating diffusion (FD) area to a desired value and outputting electric charge, thereby resetting the floating diffusion (FD) area, a drive transistor (Dx) acting as a source follow buffer amplifier, and a select transistor (Sx) allowing addressing of the switching function. Also, a load transistor for reading an output signal is formed outside of the unit pixel.

FIG. 2 illustrates a cross-sectional view of a unit pixel of a related art CMOS image sensor and, more particularly, the main parts related to light-focusing. Referring to FIG. 2, the related art CMOS image sensor includes a semiconductor substrate 11, a field oxide layer 12 formed on the semiconductor substrate 11 to define an active area, and a photodiode (PD) 13 and a plurality of transistors 14 formed in the active area of the semiconductor substrate 11. Then, an interlayer dielectric 15 is formed on the entire structure including the photodiode (PD) 13 and the transistors 14. And, a plurality of metal circuits 16, 17, and 18 is formed on the interlayer dielectric 15 so as to form the unit pixel. The metal circuits 16, 17, and 18 are aligned so as to prevent light being irradiated to the photodiode (PD) from being blocked.

Interlayer dielectrics 19, 20, and 21 are formed between each layer of metal circuits 16, 17, and 18 for electric insulation. And, although not shown in the drawing, a passivation layer for protecting the device from humidity and scratches, R, G, and B color filter layers for representing a color image, and an overcoating layer are formed on the last interlayer dielectric 21. And, a micro-lens 22 having a dome structure and formed of a photoresist material is formed on the overcoating layer. The micro-lens 22 deposits a photoresist layer on the overcoating layer, which is patterned so that the photoresist remain on the photodiode (PD). Then, the photoresist is treated with a baking process so as to induce the photoresist to leak, thereby obtaining a desired curvature. The above-described micro-lens 22 plays an important role of focusing the irradiated light and transmitting the focused light to the photodiode (PD). However, as high density devices are being developed, the metal circuits should be formed in different layers, thereby increasing the thickness of the interlayer dielectrics. Thus, the micro-lens 22 becomes insufficient for appropriately focusing and transmitting light to the photodiode (PD).

FIGS. 3A to 3D illustrate problems shown in the related art CMOS image sensor. Referring to FIG. 3A, the related art CMOS image sensor the focused light passing through the micro-lens 22 is concentrated only on the center portion of the photodiode (PD), which causes a difference in amount of light between the edge portion and the center portion, thereby generating a dark current in the edge portion of the photodiode. Thus, when the irradiated light is converted into an electric signal, as shown in FIG. 3B, and outputted through a display device, the picture image is distorted at the edge portion and the clearness of the image is deteriorated.

Furthermore, referring to FIG. 3C, when the light is not irradiated in a direction parallel to the axis of the micro-lens and is irradiated to have an inclination, the light cannot be accurately focused on the photodiode and is focused more on another area, thereby reducing the intensity of the signal. Therefore, as shown in FIG. 3D, the outputted image may be focused to one side, and problems of distorted image and unclearness at the edge portion may occur. As the size of the unit pixel is reduced, the thickness of the upper structures, such as the interlayer dielectrics 15, 19, 20, and 21 and the metal circuits 16, 17, and 18 formed on the photodiode, are increased, as compared to the size of the photodiode. Such problems are aggravated as the number of metal circuits increases and the thickness of the structure is increased due to the high integration of the device, thereby causing problems in device integration. This problem may be resolved if the micro-lens 22 is formed on a lower portion, instead of the uppermost portion. However, if a later (or following) process is performed after forming the micro-lens 22 using the photoresist as material, the photoresist may leak due to the heat of the following process, and so such method cannot be actually applied.

SUMMARY OF THE INVENTION

Accordingly, the present invention is directed to a CMOS image sensor and a method of fabricating the same that substantially obviate one or more problems due to limitations and disadvantages of the related art.

An object of the present invention is to provide a CMOS image sensor and a method of fabricating the same that can easily focus light to enhance signal distortion or deterioration of signal characteristics.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, in a complementary metal-oxide semiconductor (CMOS) image sensor including a photodiode receiving irradiated light and generating electric charges, a plurality of conductive circuits each formed in different layers, a plurality of interlayer dielectrics insulating the conductive circuits, and a micro-lens formed of the interlayer dielectrics and focusing the irradiated light to the photodiode, the CMOS image sensor includes a lens formed in a dome shape on any one of the interlayer dielectrics and refocusing the light focused by the micro-lens to the photodiode.

Herein, the lens may be formed of a nitride layer, and lens may include a dome-shaped oxide layer, and a nitride layer formed on a surface of the oxide layer.

In another aspect of the present invention, in a method of fabricating a complementary metal-oxide semiconductor (CMOS) image sensor, wherein the CMOS image sensor includes a photodiode receiving irradiated light and generating electric charges, a plurality of conductive circuits each formed in different layers, a plurality of interlayer dielectrics insulating the conductive circuits, and a micro-lens formed of the interlayer dielectrics and focusing the irradiated light to the photodiode, the method includes forming a lens for refocusing the light focused by the micro-lens to the photodiode, wherein the step of forming a lens includes a first step of randomly forming one of the interlayer dielectrics and forming a nitride layer on an entire surface thereof, a second step of depositing a photoresist layer on the nitride layer, and patterning the photoresist layer so that a set portion of photoresist remains in a corresponding area, a third step of selectively removing the nitride layer by using the patterned photoresist layer as a mask, and removing the photoresist layer, a fourth step of rounding corner portions of the selectively removed nitride layer by using a high frequency bias sputter etch process, and a fifth step of forming the nitride layer in a dome shape by using a wet-etch process.

The method of fabricating a complementary metal-oxide semiconductor (CMOS) image sensor may include before the second step, a step of performing a reflow process on the patterned photoresist. And, the fourth step includes a radio frequency bias sputter etch process using helium (He) and a radio frequency bias sputter etch process using silver (Ar), which are performed simultaneously.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
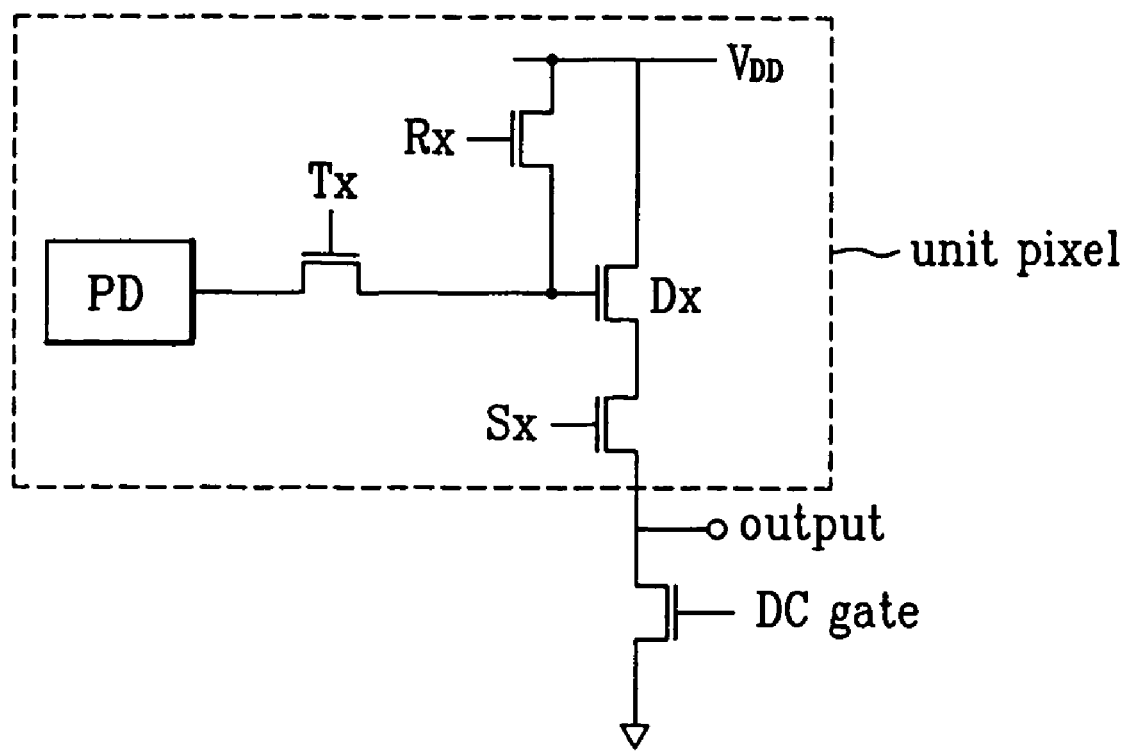
FIG. 1 illustrates a circuit diagram of a unit pixel of a general CMOS image sensor.
Figure 2:
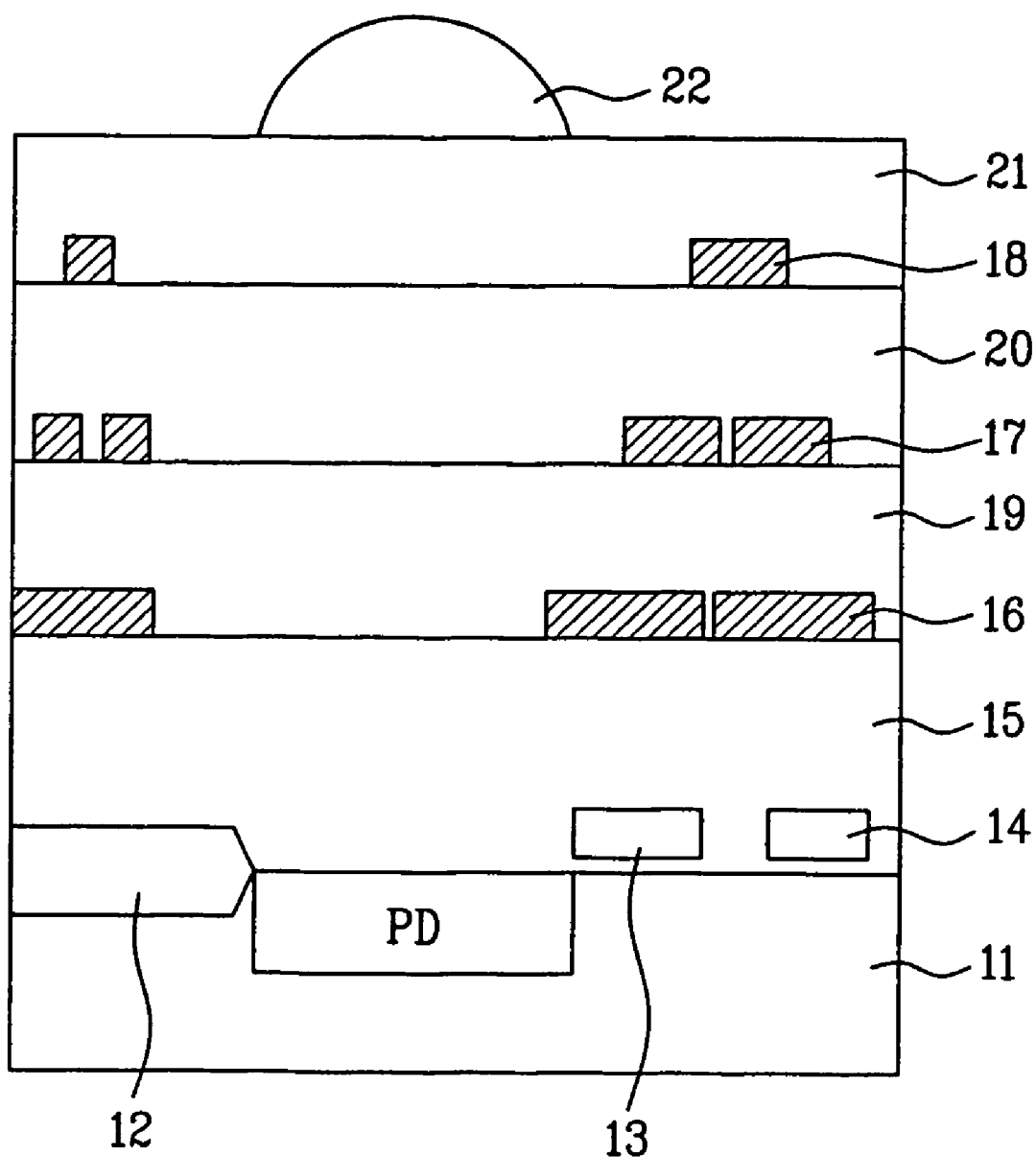
FIG. 2 illustrates a cross-sectional view of a unit pixel of a related art CMOS image sensor.
Figure 3A:
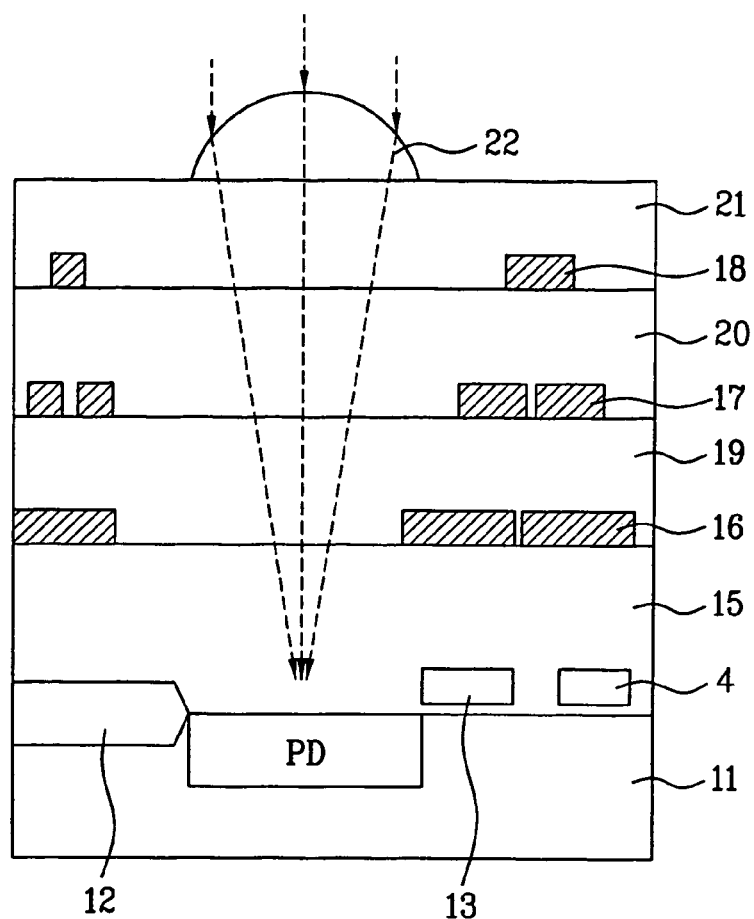
FIGS. 3A to 3D illustrate problems shown in the related art CMOS image sensor.
Figure 3B:
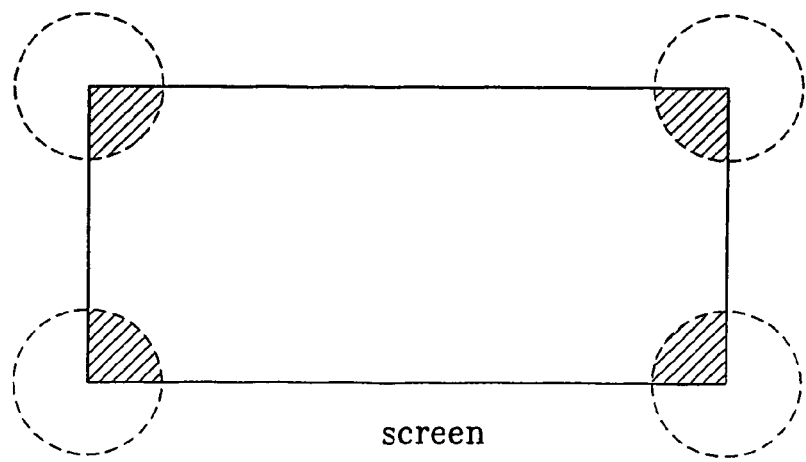
Figure 3C:
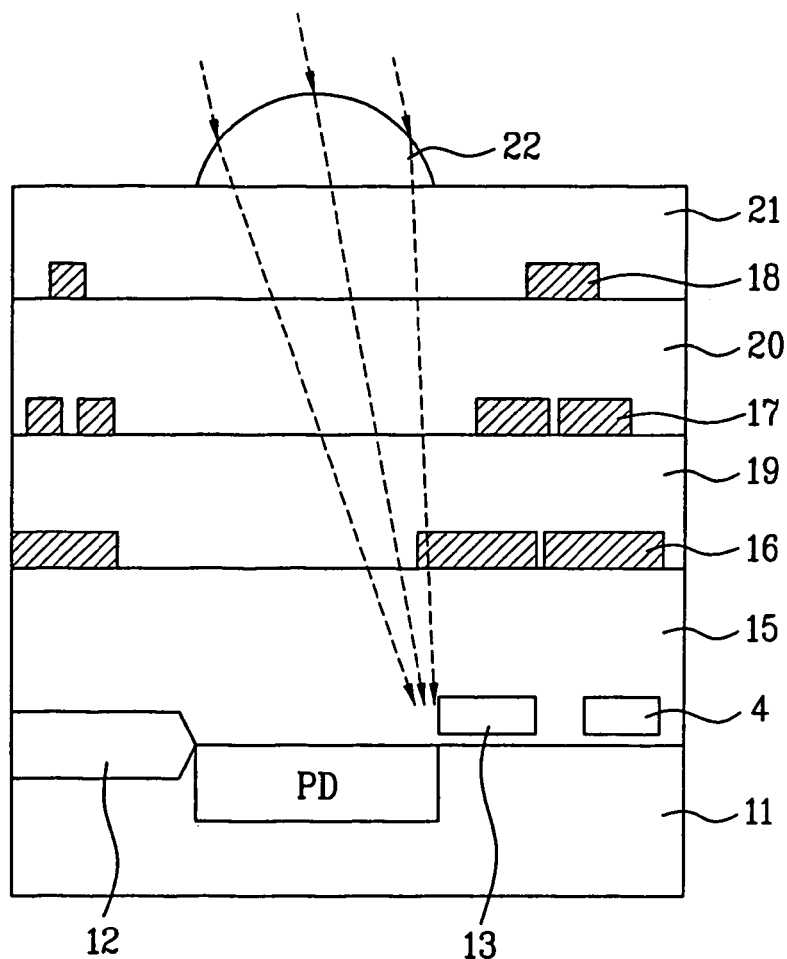
Figure 3D:
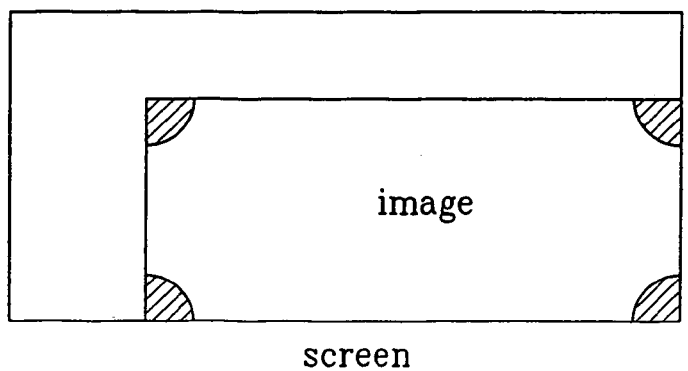
Figure 4:
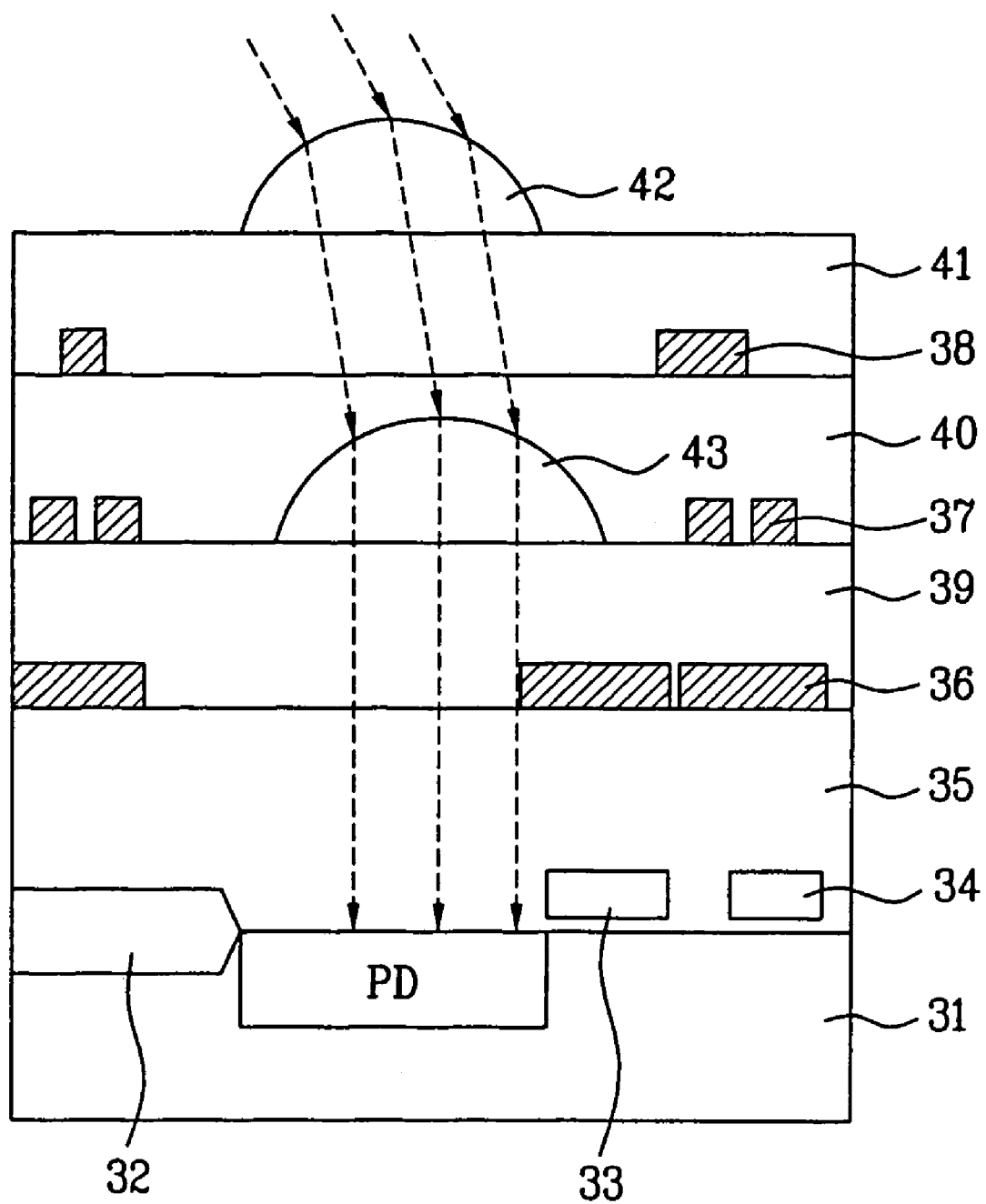
FIG. 4 illustrates a cross-sectional view showing a process step for fabricating a CMOS image sensor according to an embodiment of the present invention.

FIG. 4 illustrates a cross-sectional view showing a process step for fabricating a CMOS image sensor according to an embodiment of the present invention. Referring to FIG. 4, the CMOS image sensor according to the present invention further includes a dome-shaped lens 43 formed of a nitride group material between a micro-lens 42 on an uppermost layer and a photodiode (PD). More specifically, a field oxide layer 32 for defining an active area and a field area is formed on the semiconductor layer 31, and a photodiode (PD) 33 and a plurality of transistors 34 are formed on the active area of the semiconductor layer 31. Also, an interlayer dielectric 35 is formed on the entire surface of the structure including the photodiode (PD) 33 and the transistors 34, and a plurality of metal circuits 36, 37, and 38 forming the unit pixel is formed on the interlayer dielectric 35 in different layers. The metal circuits 36, 37, and 38 are aligned so as to prevent the light being irradiated to the photodiode (PD) from being blocked.

Interlayer dielectrics 39, 40, and 41 are formed between each layer of metal circuits 36, 37, and 38 for electric insulation. And, although not shown in the drawing, a passivation layer for protecting the device from humidity and scratches, R, G, and B color filter layers for representing a color image, and an overcoating layer are formed on the last interlayer dielectric 41. And, a micro-lens 42 having a dome structure and formed of a photoresist material is formed on the overcoating layer. Then, a dome-shaped lens 43 formed of a nitride group material is formed on the interlayer dielectric 39 between the photodiode (PD) 33 and the micro-lens 42, which can easily transmit the light passing through the micro-lens 42 to the photodiode (PD). Herein, the lens 43 is formed of a nitride group material, which is highly heat resistant, instead of a photoresist material because the photoresist material may leak due to the temperature of a following process. The above description is an example of the lens 43 being formed on the interlayer dielectric 39. However, the lens 43 may also be formed on different interlayer dielectrics 35 or 37 between the photodiode (PD) and the micro-lens 42.

The method of fabricating the lens 43 will now be described in detail. The members parts other than the lens 43 are identical to those described above, and the description of the other members parts will, therefore, be omitted for simplicity. FIGS. 5A to 5D illustrate cross-sectional views showing process steps for fabricating a lens according to an embodiment of the present invention. And, FIGS. 6A and 6B illustrate cross-sectional views showing the process steps for fabricating the CMOS image sensor according to the present invention, wherein a photoresist reflow process is included.

Figure 5A:
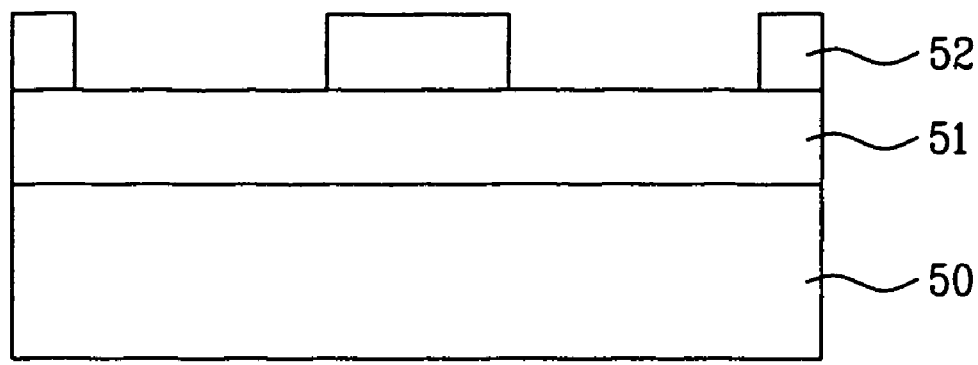
FIGS. 5A to 5D illustrate cross-sectional views showing process steps for fabricating a lens according to an embodiment of the present invention.
Figure 5B:
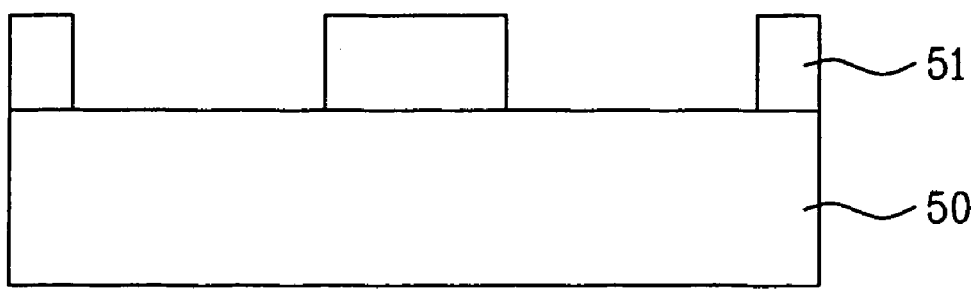
Figure 6A:
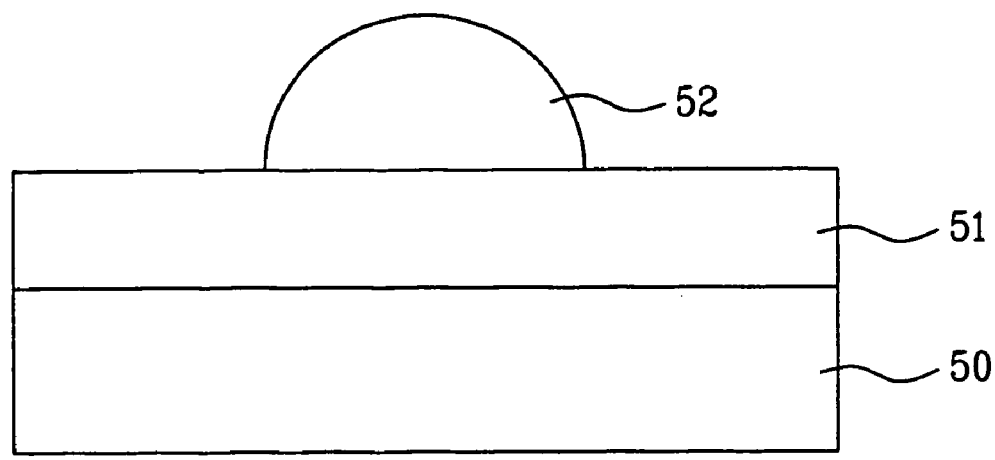
FIGS. 6A and 6B illustrate cross-sectional views showing the process steps for fabricating the CMOS image sensor according to the present invention, wherein a photoresist flow process is included.
Figure 6B:
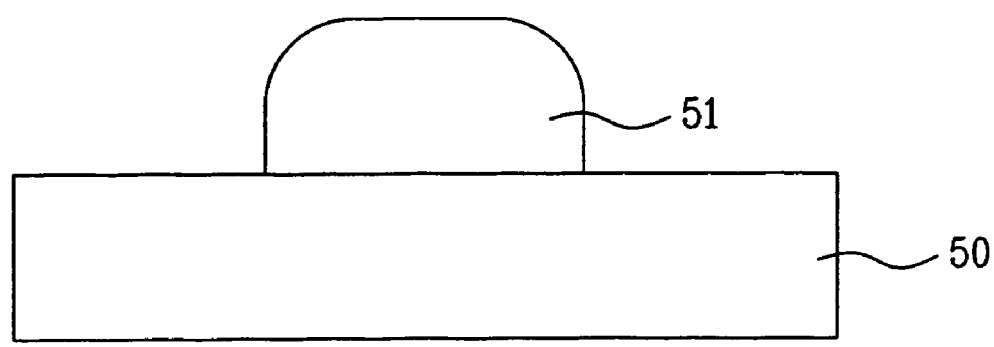

Referring to FIG. 5A, a sub layer 50 having a field oxide layer, a photodiode, a transistor, a metal circuit, and an interlayer dielectric formed thereon is deposited on a nitride layer 51. A photoresist layer 52 is deposited on the nitride layer 51. And, then, the photoresist layer 52 is selectively patterned by using light exposure and development processes, thereby leaving the photoresist only on a specific portion for forming the lens. Subsequently, as shown in FIG. 5B, by using the patterned photoresist 52 as a mask, the nitride layer 51 is treated with a dry-etch process, so as to remove the photoresist 52.

In order to enhance efficiency, after patterning the photoresist 52, the patterned photoresist 52 is treated with a baking process, so as to perform a reflow process on the photoresist 52. Then, as shown in FIG. 6A, a curvature is formed on the photoresist 52. And, when the nitride layer 51 therebelow is etched by using the photoresist 52 as the mask, a slight curvature is formed in advance on the nitride layer 51, as shown in FIG. 6B.

Figure 5C:
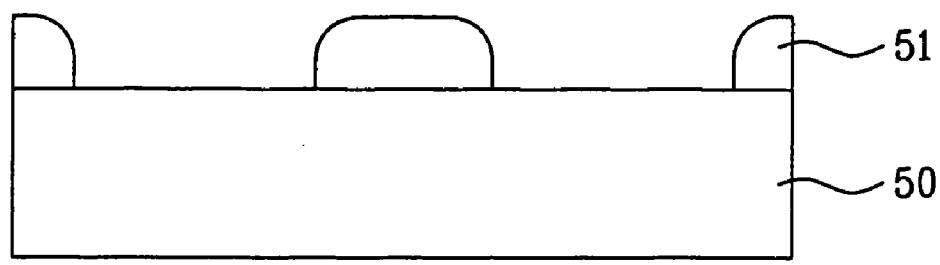
Figure 5D:
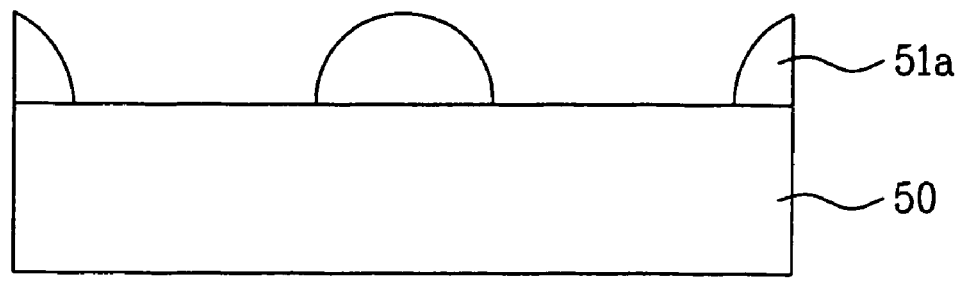

Thereafter, referring to FIG. 5C, a radio frequency sputter etch is performed. Due to its characteristics, the RF bias sputter etch has a greater etch rate on the corner portions, and so the corners of the nitride layer 51 are etched to have rounded edges, as shown in FIG. 5C.

Figure 7:
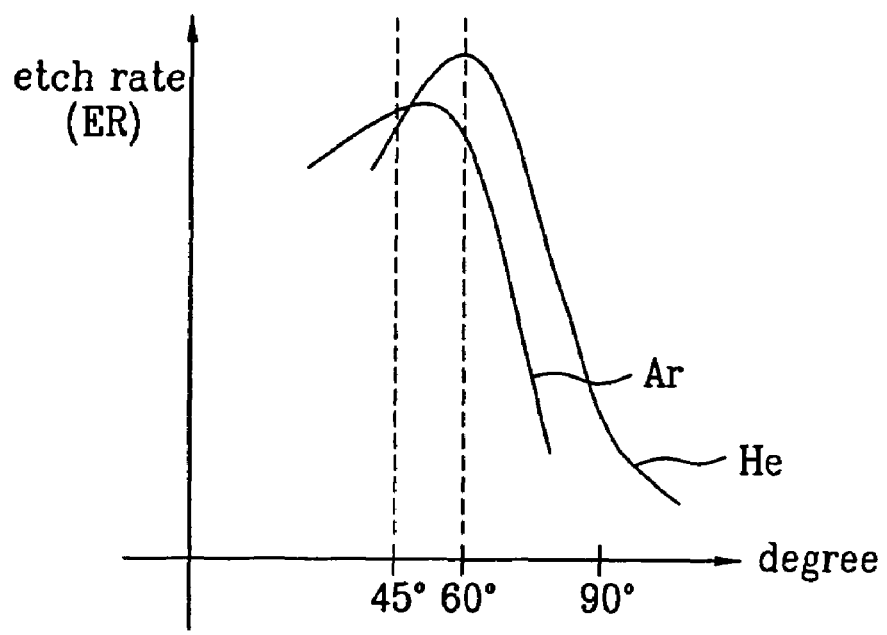
FIG. 7 illustrates a graph showing characteristics of a radio frequency (RF) sputter etch process.
Figure 8:
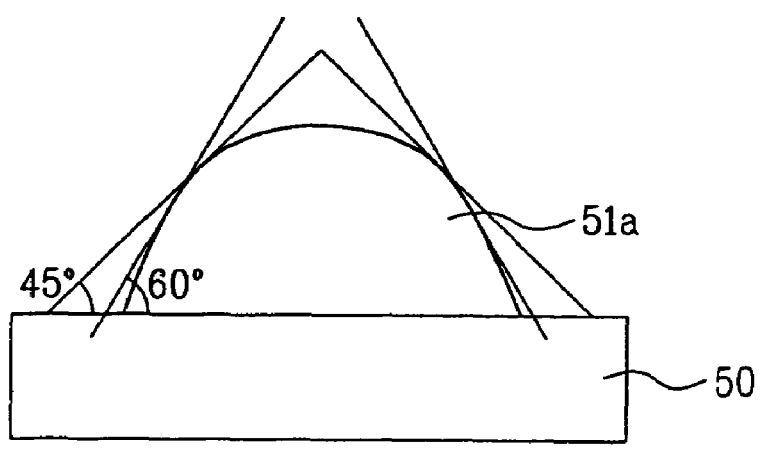
FIG. 8 illustrates a combination of a radio frequency (RF) bias sputter etch using helium (He) and a radio frequency (RF) bias sputter etch using silver (Ar)

FIG. 7 illustrates a graph showing characteristics of a radio frequency (RF) sputter etch process. More specifically, FIG. 7 illustrates a graph showing etch rates in accordance with the degrees of the radio frequency (RF) bias sputter etch process using helium (He) and the radio frequency (RF) bias sputter etch process using silver (Ar). And, FIG. 8 illustrates a combination of a radio frequency (RF) bias sputter etch using helium (He) and a radio frequency (RF) bias sputter etch using silver (Ar).

Generally, the RF bias sputter etch process shows a different etch rate depending upon the degree. Therefore, as shown in FIG. 7, when performing the RF bias sputter etch rate using helium (He), the etch rate is at a maximum level at 60°. And, when performing the RF bias sputter etch rate using silver (Ar), the etch rate is at a maximum level at 45°.

Therefore, in order to increase the sensitivity of the curvature of the lens, the RF bias sputter etch process using helium (He) and the RF bias sputter etch process using silver (Ar) are performed in combination. Then, as shown in FIG. 8, when the etching process is repeated by performing the RF bias sputter etch process using helium (He) along a direction of 60° and by performing the RF bias sputter etch process using silver (Ar) along a direction of 45°, the curvature of the etched nitride layer becomes more smooth. Subsequently, referring to FIG. 5D, a wet-etch process is performed so as to wear out the corner portions of the nitride layer 51, thereby forming a dome-shaped lens 51*a*.

Figure 9A:
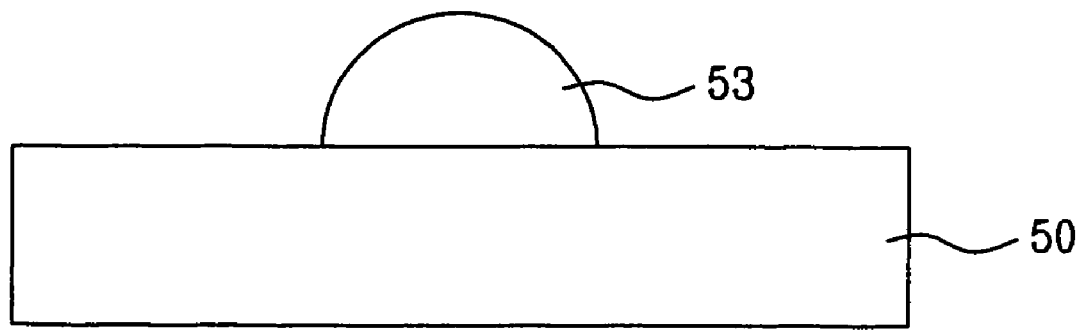
FIGS. 9A and 9B illustrate cross-sectional views showing the process steps for fabricating the lens according to another embodiment of the present invention.
Figure 9B:
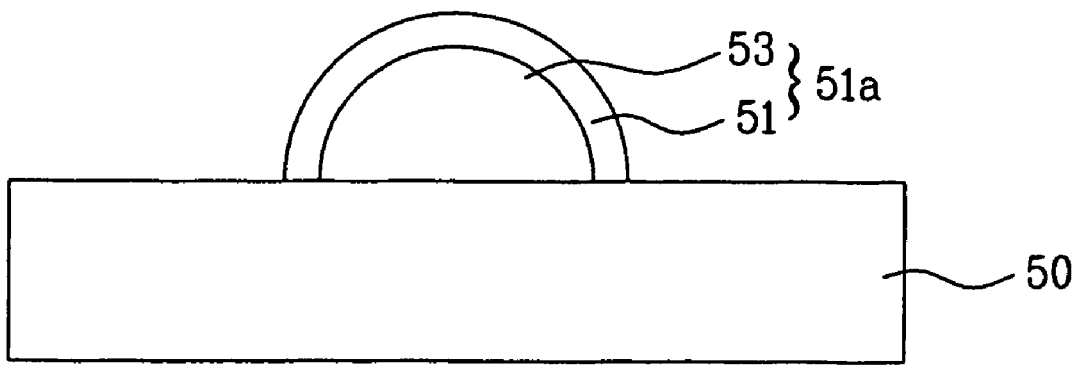

FIGS. 9A and 9B illustrate cross-sectional views showing the process steps for fabricating the lens according to another embodiment of the present invention. Herein, a dome-shaped oxide layer 53 is formed, and a nitride layer 51 is deposited on the oxide layer 53, thereby forming a double-layered lens 51*a* of oxide layer and nitride layer.

As described above, the CMOS image sensor and the method of fabricating the same has the following advantages. A lens is provided between a micro-lens and a photodiode, so as to transmit light to the photodiode, thereby enhancing light-focusing efficiency of the image sensor. Also, a lens is formed between the micro-lens and the photodiode, so as to allow the light to be transmitted to the entire surface of the photodiode, thereby preventing image distortion at corner portions of the image and unclearness of the image, which is caused by dark current, from occurring.

Furthermore, light passing through the lens is focused once again, thereby allowing a certain amount of variation in the fabrication process of the micro-lens. And, thus, a margin of the micro-lens fabrication process can be enhanced. And, finally, even when the micro-lens and the photodiode become spaced further apart, the lens allows the light to be focused on the photodiode, thereby improving the degree of integration of the CMOS image sensor.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A complementary metal-oxide-semiconductor (CMOS) image sensor, comprising:
   a photodiode receiving irradiated light and generating electric charges;
   a plurality of conductive circuits formed in different layers;
   a plurality of interlayer dielectrics insulating the conductive circuits;
   a micro-lens formed on the interlayer dielectrics and focusing the irradiated light to the photodiode; and
   a second lens having a dome shape formed on any one of the interlayer dielectrics and refocusing the light focused by the micro-lens to the photodiode, wherein the second lens comprises a dome-shaped oxide layer and a nitride layer formed on a surface of the dome-shaped oxide layer.

\* \* \* \* \*